United States Patent [19]

Murashita et al.

[11] Patent Number: 5,650,783
[45] Date of Patent: Jul. 22, 1997

[54] DATA CODING/DECODING DEVICE AND METHOD

[75] Inventors: Kimitaka Murashita; Yoshiyuki Okada; Shigeru Yoshida, all of Kawasaki, Japan

[73] Assignee: Fujitsu Limited, Kawasaki, Japan

[21] Appl. No.: 525,076

[22] Filed: Sep. 8, 1995

[30] Foreign Application Priority Data

Feb. 10, 1995 [JP] Japan ..................... 7-023019

[51] Int. Cl.[6] .................................. H03M 7/20
[52] U.S. Cl. ...................... 341/107; 341/51; 341/87; 341/59
[58] Field of Search ................. 341/51, 50, 107, 341/87

[56] References Cited

U.S. PATENT DOCUMENTS

| | | | |
|---|---|---|---|
| 4,989,000 | 1/1991 | Chevion et al. ................. | 341/107 |
| 5,142,283 | 8/1992 | Chevion et al. ................. | 341/107 |
| 5,254,990 | 10/1993 | Yoshida et al. ................. | 341/51 |
| 5,357,250 | 10/1994 | Healey et al. ................. | 341/107 |
| 5,546,080 | 8/1996 | Langdon, Jr. et al. ........... | 341/107 |
| 5,550,540 | 8/1996 | Furlan et al. .................. | 341/51 |

*Primary Examiner*—Jeffrey A. Gaffin
*Assistant Examiner*—Jason H. Vick
*Attorney, Agent, or Firm*—Staas & Halsey

[57] ABSTRACT

A device for coding a series of symbols based on a multi-level arithmetic coding scheme includes a coding unit for coding the symbols based on frequency of occurrence of the symbols and orders of the symbols according to the frequency of occurrence, a context holding unit for storing the frequency of occurrence and the orders, a context updating unit for updating the frequency of occurrence and the orders upon receiving a control signal, and a controlling unit for sending the control signal when one of the symbols is coded and a cumulative frequency is less than a predetermined value, wherein the cumulative frequency is a sum of the frequency of occurrence for all of the symbols.

22 Claims, 19 Drawing Sheets

FIG. IA
| SYMBOL | FREQUENCY | RANGE |
|--------|-----------|-------------|
| a | 0.20 | [0, 0.2) |
| b | 0.10 | [0.2, 0.3) |
| c | 0.05 | [0.3, 0.35) |
| d | 0.15 | [0.35, 0.5) |
| e | 0.50 | [0.5, 1) |
FIG. IC
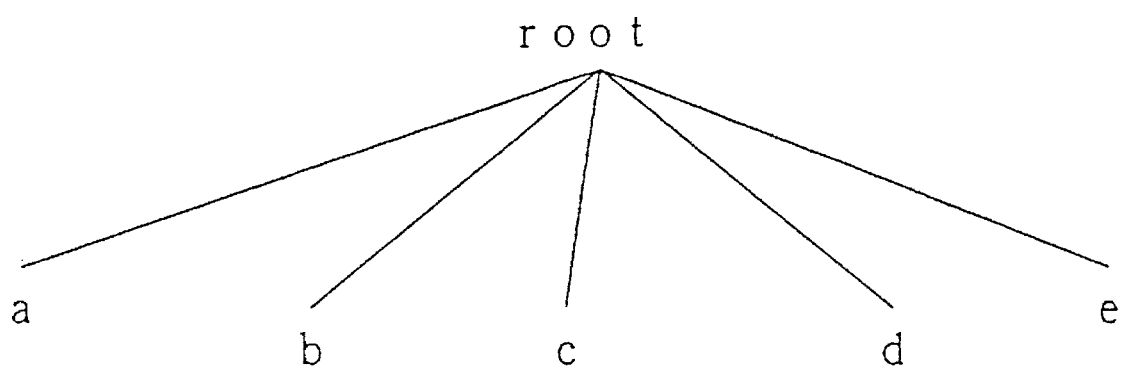

FIG. 4A

| ORDER OF FREQUENCY | SYMBOL | FREQUENCY | CUMULATIVE FREQUENCY |
|---|---|---|---|
| 0 | ----- | 0 0 | 3 2 7 |
| 1 | 0 0 | 1 0 | 3 1 7 |
| 2 | 0 1 | 7 | 3 1 0 |
| 3 | 0 2 | 4 | 3 0 6 |
| ⋮ | ⋮ | ⋮ | ⋮ |
| n−1 | 'M' | 2 | m 2 |
| n | 'N' | 1 | m 1 |
| ⋮ | ⋮ | ⋮ | ⋮ |
| X | 'A' | 1 | m 0 |
| ⋮ | ⋮ | ⋮ | ⋮ |
| 2 5 4 | F D | 1 | 3 |
| 2 5 5 | F E | 1 | 2 |
| 2 5 6 | F F | 1 | 1 |
| 2 5 7 | E O F | 1 | 0 |

DATA CODING/DECODING DEVICE AND METHOD

BACKGROUND OF THE INVENTION

1. Field of the Invention

The present invention generally relates to data coding methods and devices, and particularly relates to a method and a device which encodes input data according to a variable-length coding scheme based on frequency of data-series occurrence in past data, and decodes coded data based on a history of past decoded data.

2. Description of the Related Art

In recent years, data used in computers has come to include a wider variety of data types such as character codes, vector information, images, etc. With this widening variety of data types, a rapid increase has been seen in the amount of data treated in computers.

When a large amount of data is treated, redundancies included in the data are eliminated as much as possible to compress the data, which leads to a reduction in memory volumes and an increase in data-transmission speed. An example of methods used in such data compression includes the Universal Coding method, which can compress any types of data. The same as the Universal Coding method, the present invention can be applied not only to the compression of character codes but also to the compression of a wide variety of data. Hereinafter, terminology used in information theory is employed, so that a character refers to a unit of one word in data, and a character string refers to a series of words.

Methods of compressing text data, files, etc. include a dictionary-type coding method which utilizes analogies in data series, and a statistical-type coding method which utilizes occurrence frequency of data-series. A typical method for the statistical-type coding is an arithmetic coding method. This method is regarded as being capable of coding data with the maximum efficiency when occurrence frequency for data from an information source can be known. This method does not encode each character one by one as does the Huffman coding method, but treats a character string in its entirety to boost an efficiency in data compression. The term "arithmetic coding" comes from the fact that coded words are derived through calculation and represented by binary numbers including numbers below a decimal point.

These coding (decoding) methods require a large number of steps, so that processing time is long and difficult to shorten. Thus, it is required to simplify the steps and make the processing faster.

In general, there are two types of the arithmetic coding method, i.e., a binary arithmetic coding method and a multi-level (more than two) arithmetic coding method. Details of the binary arithmetic coding method and the multi-level arithmetic coding method may be made to "Arithmetic Coding for Data Compression" by Jan H. Witten et al. (Commun. of ACM Vol. 30, No. 6, pp.520–540) and "An Adaptive Dependency Source Model for Data Compression Scheme" by D. M. Abrahamson (Commun. of ACM, Vol. 32, No. 1, pp.7783).

An example of the multi-level arithmetic coding scheme is shown in FIGS. 1A and 1B. As shown in FIG. 1B, when events of characters (hereinafter called symbols) are to be encoded, a range P ($0 \leq P < 1$) (hereinafter referred to as [0,1)) is divided by the number of the symbols. Here, a length of a divided range, which corresponds to one of the symbols, is in proportion to frequency of occurrence of the symbol. The frequency of occurrence is shown in FIG. 1A for symbols "a", "b", "c", "d", "e".

Imagine that an incoming character string is "abe". First, the range corresponding to the first symbol in that character string is selected. Then, the selected range is divided by the number of all the symbols as in the same manner as before. Here, lengths of newly divided ranges are also proportional to frequency of occurrence of each symbol.

Further, the range corresponding to the second symbol in the character string is selected from the selected range corresponding to the first symbol. Finally, the range corresponding to the third symbol in the character string is selected from the selected range corresponding to the second symbol. The finally selected range represents the character string "abe". These divisions and selections of the ranges are shown in FIG. 1B. Also, in FIG. 1B, the finally selected range representing the character string "abe" is shown.

Compressed codes for the character string "abe" are binary codes which represent an arbitrary point within the finally selected range. Through the same procedure, compressed codes for any character string can be obtained.

Methods of dividing ranges include a static coding method which divides ranges according to frequency of occurrence prepared in advance. In this case, the frequency of occurrence used for dividing ranges does not reflect actual frequency of occurrence of the incoming character string. Also, the methods of dividing ranges include a semi-adaptive coding method which divides ranges according to frequency of occurrence derived by scanning the entire character string before coding. Furthermore, the methods of dividing ranges include an adaptive coding method which updates ranges by calculating frequency of occurrence for each incoming symbol. The present invention is categorized as one of adaptive coding methods, and can encode data through one path.

In the static or semi-adaptive coding methods, all the symbols appearing in incoming data are registered in a context tree as shown in FIG. 1C, and the range is divided beforehand by these symbols. In the adaptive coding method, however, symbols appearing in the incoming data are registered in the context tree as the coding of the data proceeds.

In the adaptive coding method, a code representing "not registered" (hereinafter referred to as ESC or an escape code) is listed in the context tree. When an incoming symbol is not registered in the context tree, ESC and raw data are output. Then, the symbol is added to the context tree, frequency of occurrence is recalculated, and ranges are newly divided according to the recalculated frequency of occurrence. In order to decode the codes, a range represented by the codes is obtained to reconstruct the symbol.

In order to further enhance the compression rate, a dependency of an incoming symbol on preceding symbols is taken into account. In this case, conditional probability of occurrence is coded through a dynamic variable-length coding scheme by taking into consideration an inter-symbol dependency (dependency of an incoming symbol on preceding symbols).

FIG. 2 is a block diagram which carries out the statistical-type coding method by incorporating the inter-symbol dependency. Input data is supplied to a context collecting unit 300. The context collecting unit 300 collects contexts representing inter-symbol relationships in character strings of the input data, and obtains conditional probabilities. The conditional probabilities obtained by the context collecting unit 300 is supplied to a variable-length coding unit 301. The variable-length coding unit 301 encodes the conditional probabilities through the variable-length coding scheme.

FIGS. 3A and 3B are illustrative drawings for explaining the context tree when the inter-symbol dependency is taken into account. In this case, the context tree becomes that of one or more orders in contrast to that of zero order shown in FIG. 1C. Here, the term "order" refers to the number of symbols in a context.

As shown in FIG. 3A, a character string including "abc" is supplied. "c" is the symbol to be coded, and " . . . ab" is the context for coding the symbol "c". Such a context is represented by the context tree shown in FIG. 3B. As shown in FIG. 3B, the context is represented by a tree having a root and branches which represent each symbol appearing in the character string. In FIG. 3B, the symbol "c" to be coded is encircled. A branch above the symbol "c" to be coded is a preceding symbol "b", and another branch above the symbol "b" is a symbol "a" preceding the symbol "b". In this manner, the context " . . . ab" and the symbol "c" to be coded can be represented in the context tree. Here, each time a symbol is accessed, the number of occurrence is counted up. Then, the conditional probabilities are calculated based on the number of occurrence for each symbol.

Methods of collecting contexts for calculating the conditional probability include a method of using contexts of a fixed order and a method of using blending contexts.

In the method of using contexts of a fixed order, the number of symbols as a condition for the conditional probability is fixed. For example, when the order of a context is two, two symbols preceding a symbol to be coded are considered. Then, contexts comprising these two symbols and a following one symbol are collected to calculate a conditional probability $p(y|x_1, x_2)$. Here, y denotes the symbol to be coded, and $x_1$ and $x_2$ denote an immediately preceding two symbols.

In the method of using blending contexts, the number of preceding symbols to be taken into consideration is not fixed. When a particular context appears frequently, the order is raised to elongate the length of the context. Otherwise, the order is kept at a small number. In general, when a particular set of preceding conditional symbols does not frequently appear, an estimation of the conditional probability using that particular set tends to become inaccurate. On the other hand, when a particular set of preceding conditional symbols frequently appears, an estimation of the conditional probability is accurate, leaving room for raising the order. Also, in general, when correlations between symbols are large, a higher compression rate can be obtained by using a higher order of contexts. On the other hand, when correlations between symbols are small, using a higher order of contexts results in a lower compression rate. In the blending contexts, the order of the contexts is raised by adapting to the input data, so that a higher compression rate is obtained than in the case of the fixed-order contexts.

In the multi-level arithmetic coding method described above, ranges are divided according to frequency of occurrence. Thus, a dictionary as shown in FIG. 4A is necessary for counting and recording an occurrence of each symbol.

FIG. 4A shows an example of a dictionary with no inter-symbol dependency for simplicity of explanation. When the inter-symbol dependency is taken into consideration, each symbol is categorized under each context.

In the dictionary of FIG. 4A, frequency and cumulative frequency are assigned to each symbol. Symbols are arranged from the top of the list in descending order of frequency. The cumulative frequency of a given symbol is a sum of the frequency from the rarest symbol at the bottom of the list to the given symbol, and is used when ranges are divided.

When a given symbol appears in the input data, the list in the dictionary should be rearranged according to the updated frequency of occurrence after the encoding of the given symbol. For example, when a symbol A is encoded in FIG. 4A and the frequency of occurrence for the symbol A is incremented, the list should be rearranged as shown in FIG. 4B. This is done by exchanging the symbol A with a symbol N, which is located at the top of symbols having the same frequency as the post-updated frequency of the symbol A.

When the frequency of the symbol A is incremented by 1 as shown in FIG. 4B, cumulative frequency for all symbols listed above the symbol A has to be changed. This is done by incrementing the cumulative frequency of these symbols by 1, as shown in FIG. 4C.

FIG. 5 shows a block diagram of a related-art coding device which carries out such an updating process of rearranging the dictionary. FIG. 6 shows a flowchart of the updating process.

The coding device includes a context-tree holding unit 1, a coding unit 2, a cumulative-frequency holding unit 3, a frequency holding unit 4, a sorting unit 5, a frequency updating unit 6, a cumulative-frequency updating unit 7, and an update controlling unit 8.

The context-tree holding unit 1 stores a context tree which is generated based on input data of the past. The coding unit 2 receives symbols and encodes them based on the context tree stored in the context-tree holding unit 1. The cumulative-frequency holding unit 3 stores cumulative frequency of each symbol which makes up the context tree. The frequency holding unit 4 stores frequency of occurrence for each symbol. The sorting unit 5 reads the frequency of occurrence for each symbol from the frequency holding unit 4, and reshapes the context tree according to the frequency of occurrence. The frequency updating unit 6 updates the frequency of occurrence stored in the frequency holding unit 4. The cumulative-frequency updating unit 7 updates the cumulative frequency stored in the cumulative-frequency holding unit 3. The update controlling unit 8 controls the sorting unit 5, the frequency updating unit 6, and the cumulative-frequency updating unit 7 to carry out a respective updating process when a symbol is supplied to the coding unit 2.

In FIG. 6, at a step S1, a symbol K is coded by the coding unit 2. Arrival of the symbol K is detected by the update controlling unit 8, which then controls the sorting unit 5, the frequency updating unit 6, and the cumulative-frequency updating unit 7. At a step S2, the sorting unit 5 searches for a symbol N which is located at the top of the list among symbols having the same frequency as that of the symbol K. At a step S3, the symbol K is exchanged with the symbol N. At a step S4, the frequency updating unit 7 increments the frequency of the symbol K by 1.

At a step S5, the cumulative-frequency updating unit 7 shifts a pointer for pointing to a symbol such that the pointer points to an immediately upper symbol. At a step S6, the cumulative-frequency updating unit 7 increments by 1 cumulative frequency of a symbol pointed to by the pointer.

At a step S7, the update controlling unit 8 checks whether the symbol pointed to by the pointer is at the top of the list. If it is, the procedure ends. If it is not, the procedure goes back to the step S5, and repeats the steps S5, S6, and S7.

In this manner, the frequency and the cumulative frequency are updated through the processes of the steps S3 to S7 each time a symbol is updated.

Namely, in the coding/decoding methods of the related art, each time a symbol is supplied, the frequency of occurrence and the cumulative frequency are updated, and symbols are sorted to be arranged in a descending order of frequency. Thus, a long processing time is required for treating a large number of symbols. This leads to a lower processing speed.

Accordingly, there is a need in the field of coding/decoding schemes for a coding/decoding method and a device which have a faster processing speed.

SUMMARY OF THE INVENTION

Accordingly, it is a general object of the present invention to provide a coding/decoding method and a device which can satisfy the need described above.

It is another and more specific object of the present invention to provide a coding/decoding method and a device which have a faster processing speed.

In order to achieve the above objects according to the present invention, a device for coding a series of symbols based on a multi-level arithmetic coding scheme includes a coding unit for coding the symbols based on frequency of occurrence of the symbols and orders of the symbols according to the frequency of occurrence, a context holding unit for storing the frequency of occurrence and the orders, a context updating unit for updating the frequency of occurrence and the orders upon receiving a control signal, and a controlling unit for sending the control signal when one of the symbols is coded and a cumulative frequency is less than a predetermined value, wherein the cumulative frequency is sum of the frequency of occurrence for all of the symbols.

According to the present invention, whether or not to carry out the updating of the frequency of occurrence and the orders is controlled according to the cumulative frequency derived from the symbols. Thus, the updating process can be stopped when sufficient data is collected to appropriately reflect the series of the symbols. This means that the updating process is not carried out unduly, which permits a higher processing speed.

Other objects and further features of the present invention will be apparent from the following detailed description when read in conjunction with the accompanying drawings.

BRIEF DESCRIPTION OF THE DRAWINGS

FIGS. 1A through 1C are illustrative drawings for explaining a multi-level arithmetic coding scheme;

FIGS. 4A through 4C are illustrative drawings for explaining an updating process of a dictionary used for recording and counting frequency of each symbol;

DESCRIPTION OF THE PREFERRED EMBODIMENTS

In the following, a principle and an embodiment of the present invention will be described with reference to accompanying drawings.

Figure 1B:
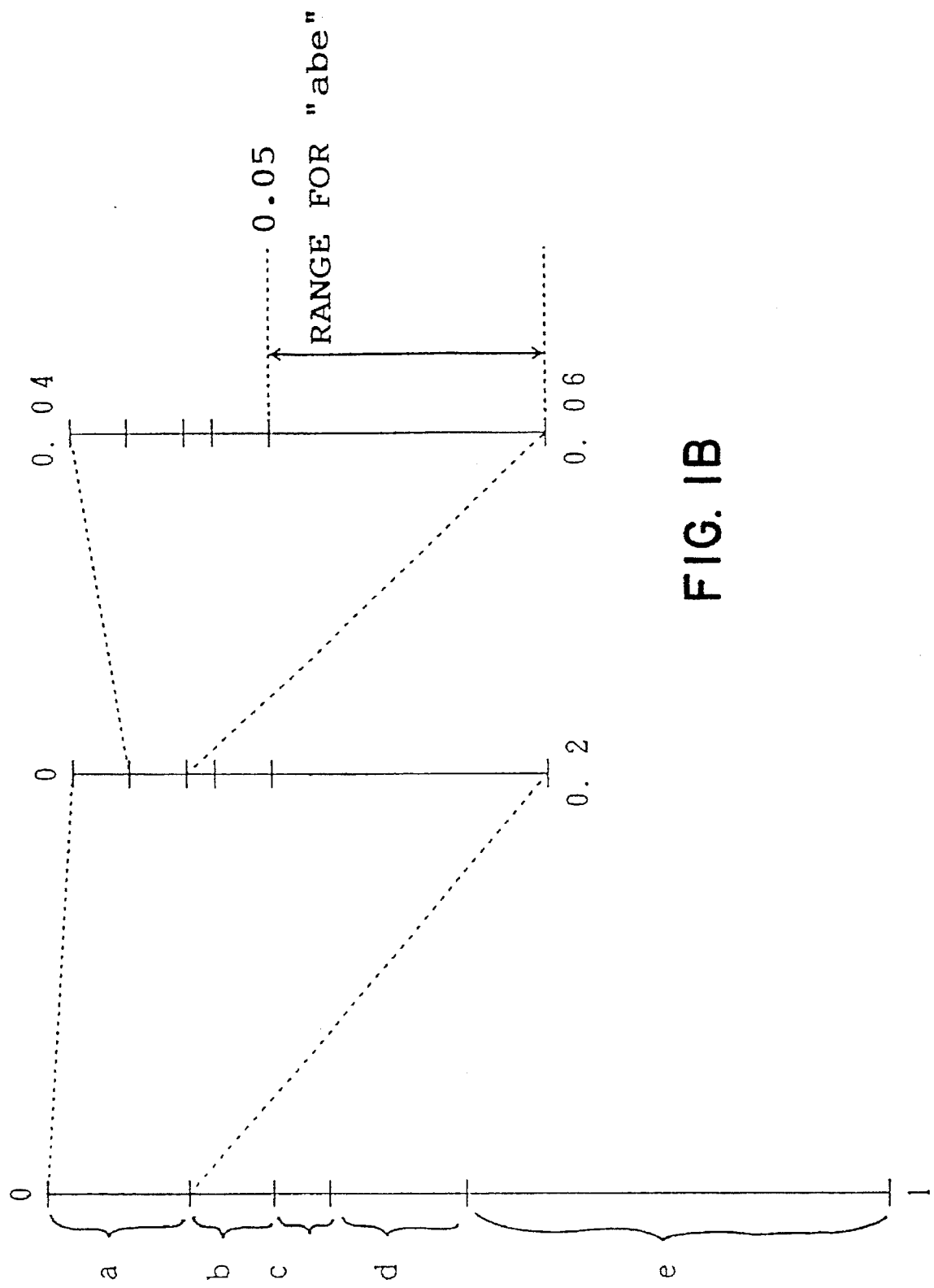
Figure 2:
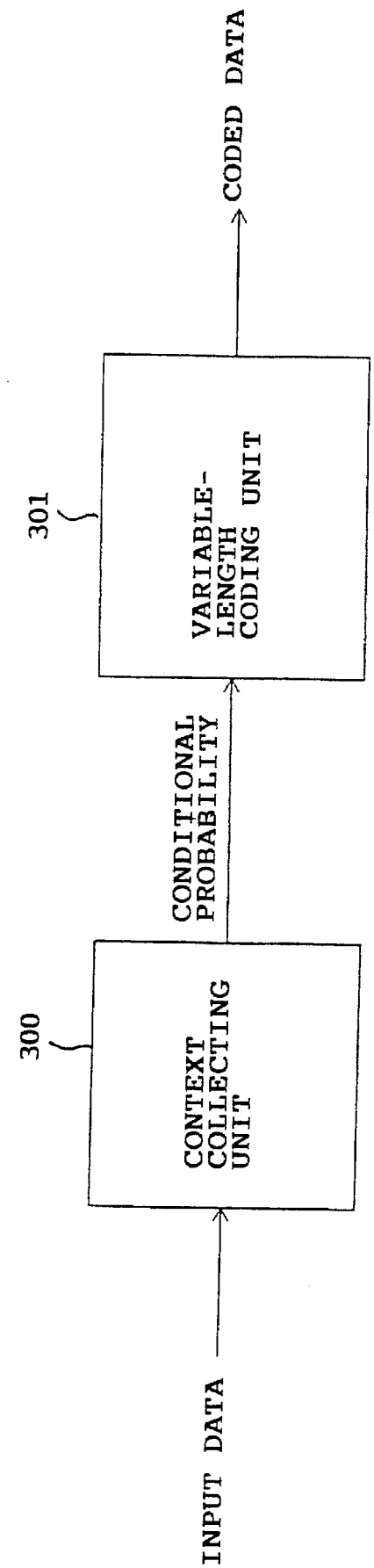
FIG. 2 is a block diagram which carries out a statistical-type coding method based on a dependency of a symbol on preceding symbols.
Figure 3A:
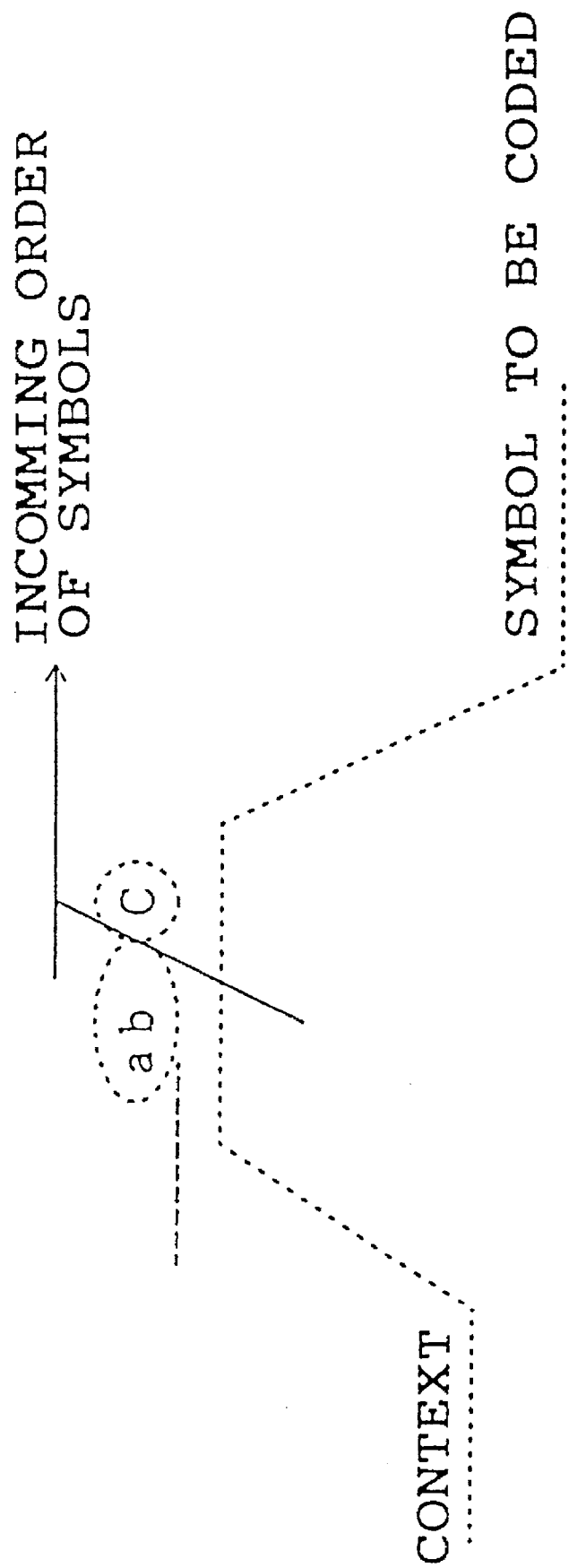
FIGS. 3A and 3B are illustrative drawings for explaining a context tree when an inter-symbol dependency is taken into account.
Figure 3B:
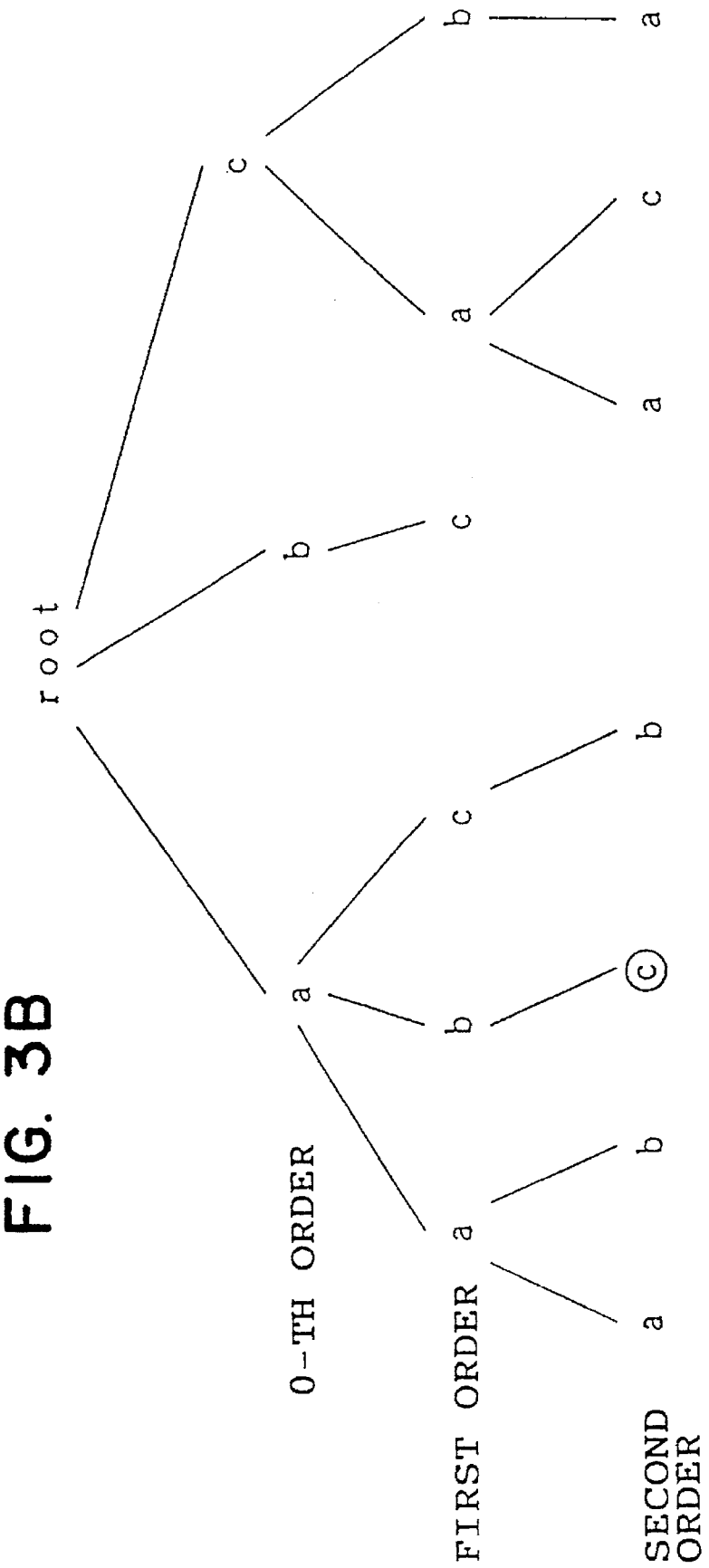
Figure 4B:
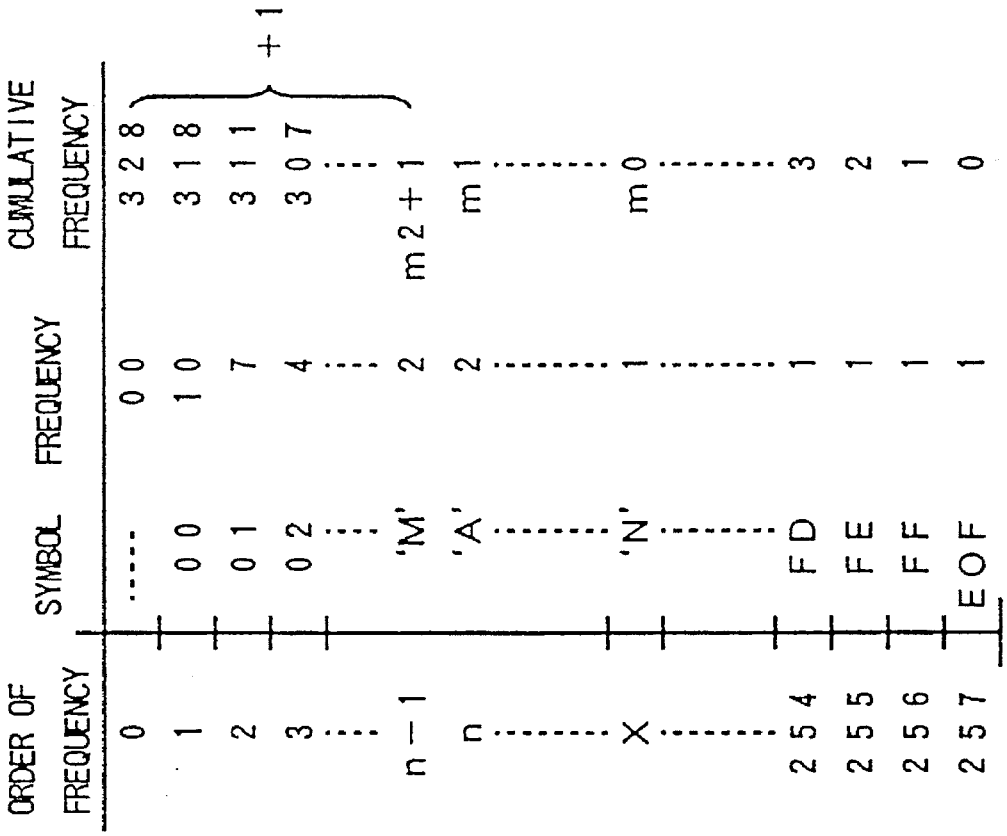
Figure 4C:
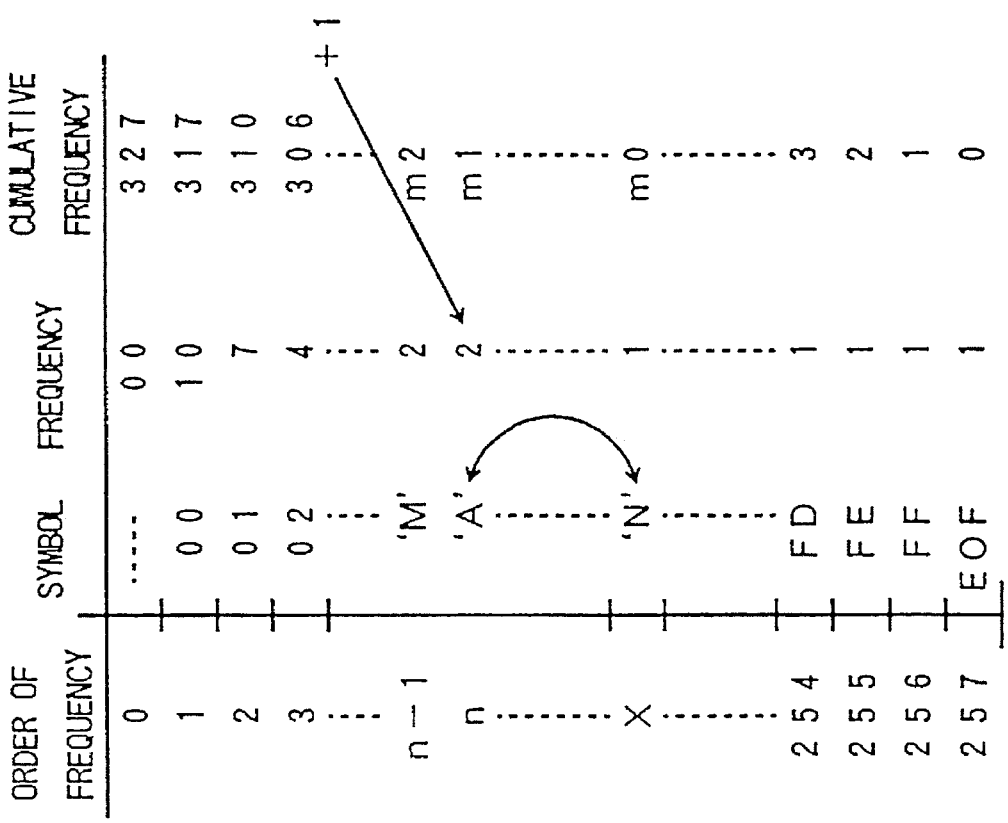
Figure 5:
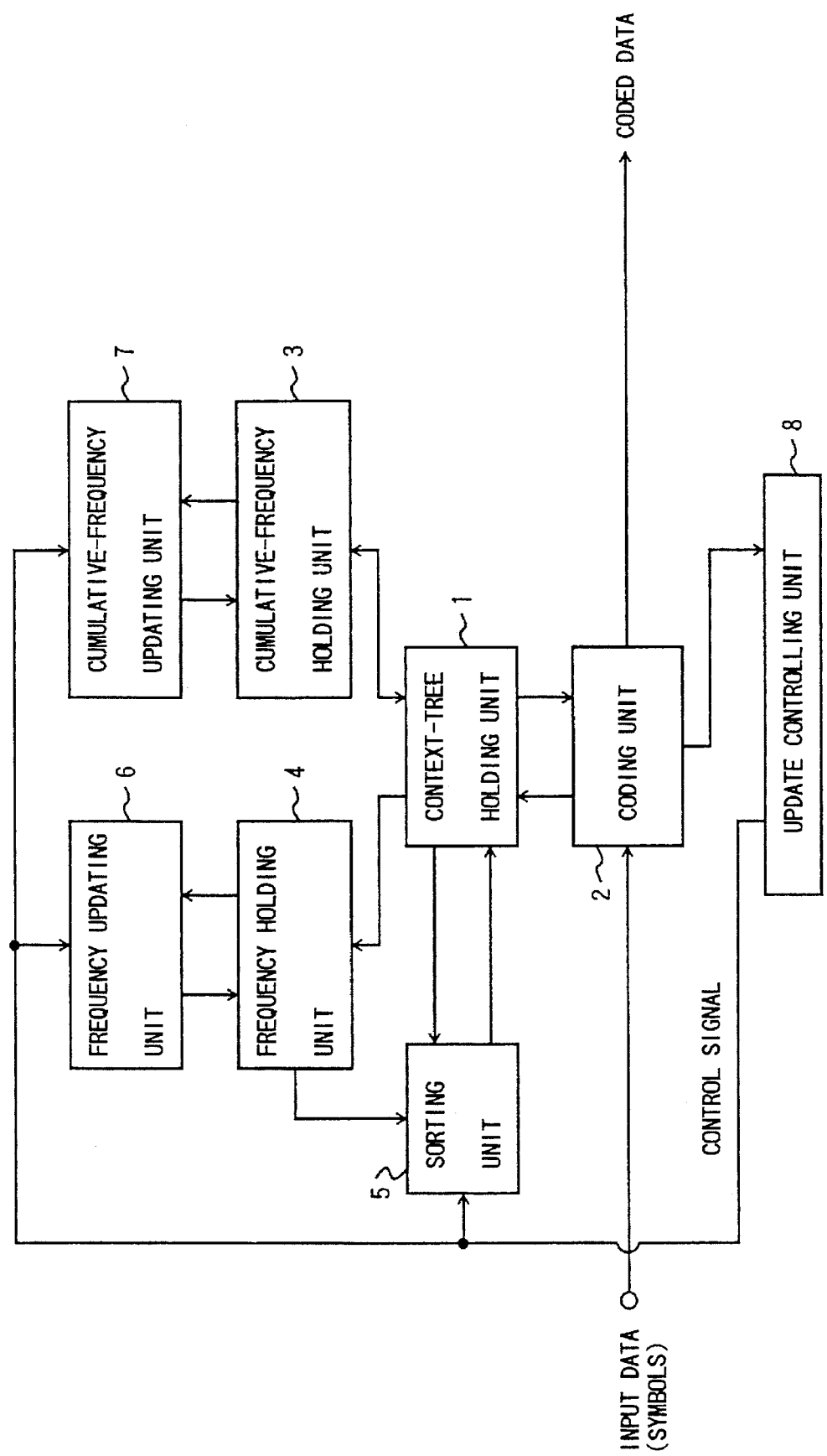
FIG. 5 is a block diagram of a related-art coding device which carries out an updating process of rearranging the dictionary.
Figure 6:
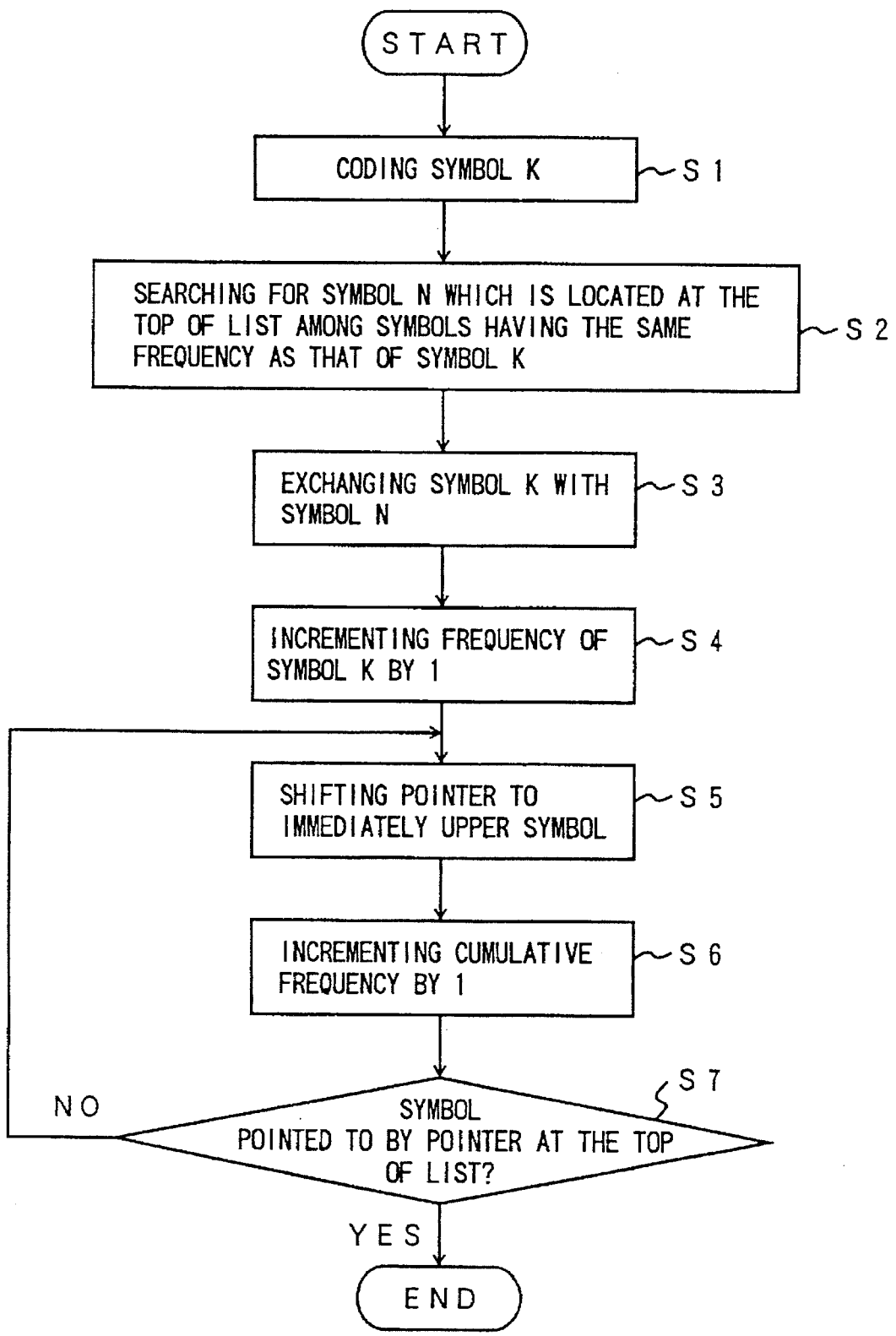
FIG. 6 is a flowchart of the updating process of the related-art coding device of FIG. 5.
Figure 7A:
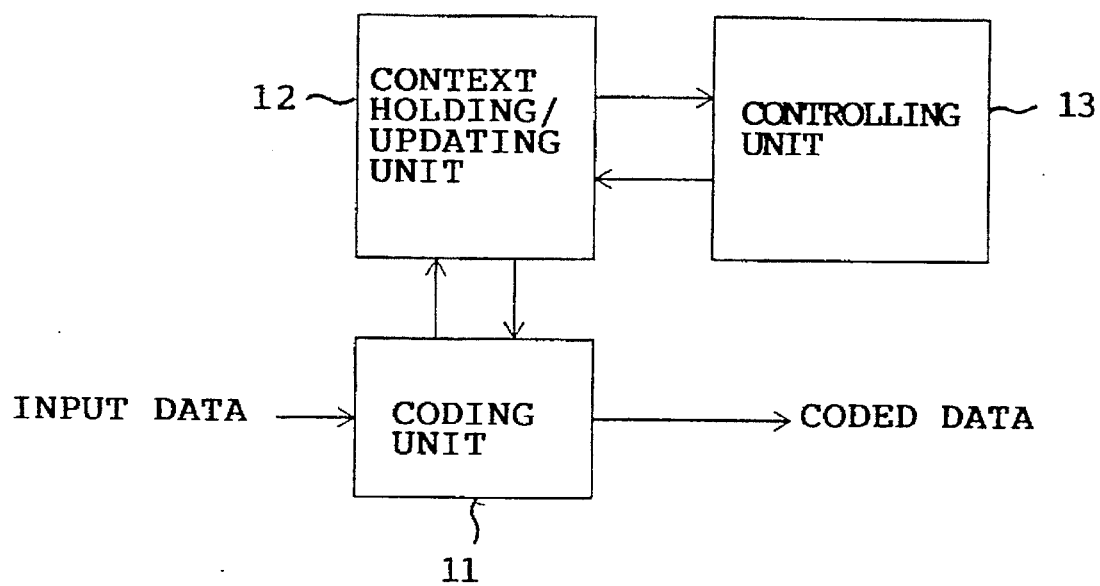
FIGS. 7A and 7B are block diagrams of a data coding device and a data decoding device, respectively, according to a principle of the present invention.
Figure 7B:
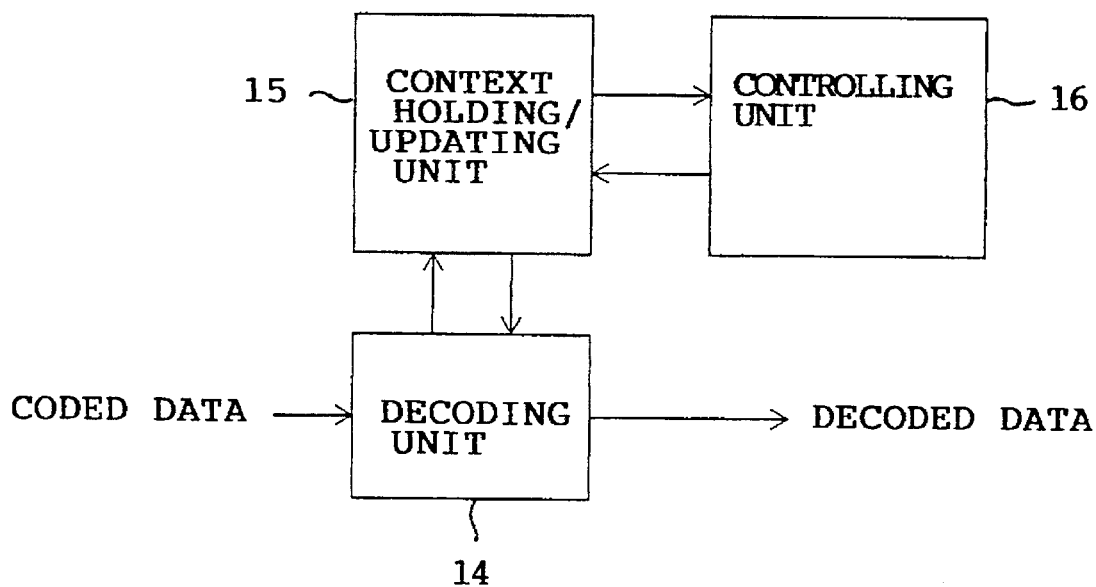

FIGS. 7A and 7B are block diagrams of a data coding device and a data decoding device, respectively, according to a principle of the present invention.

In FIG. 7A, the data coding device includes a coding unit 11, a context holding/updating unit 12, and a controlling unit 13. The coding unit 11 receives input data, and encodes it to generate coded data by using context data stored in the context holding/updating unit 12. Here, the context data includes frequency of occurrence, cumulative frequency of occurrence, and an order according to the frequency of occurrence, which are provided for each symbol under given contexts. The context holding/updating unit 12 not only stores the context data, but also updates the context data according to the frequency of occurrence of symbols appearing in the input data.

The controlling unit 13 controls the context holding/updating unit 12 to update the context data. In doing so, the controlling unit 13 compares a predetermined threshold value with a cumulative frequency of occurrence for all the symbols registered under a given context. Then, only when the cumulative frequency is smaller than the threshold value, the controlling unit 13 controls the context holding/updating unit 12 to update the context data for the given context.

In FIG. 7B, the data decoding device includes a decoding unit 14, a context holding/updating unit 15, and an controlling unit 16. The decoding unit 14 receives the coded data, and decodes it to generate decoded data by using the context data stored in the context holding/updating unit 15. The context holding/updating unit 15 not only stores the context data, but also updates the context data according to the frequency of occurrence of symbols appearing in the decoded data.

The controlling unit 16 controls the context holding/updating unit 15 to update the context data. In doing so, the controlling unit 16 compares a predetermined threshold value with a cumulative frequency of occurrence for all the symbols registered under a given context. Then, only when the cumulative frequency is smaller than the threshold value, the controlling unit 16 controls the context holding/updating unit 15 to update the context data for the given context.

According to the present invention, whether or not to carry out the updating of the context data is controlled according to the cumulative frequency of occurrence derived from the incoming data (input data or coded data). Thus, the updating process can be stopped when the context data is collected to appropriately reflect the incoming data, so that the updating process is not unduly carried out. This results in a higher processing speed.

Figure 8:
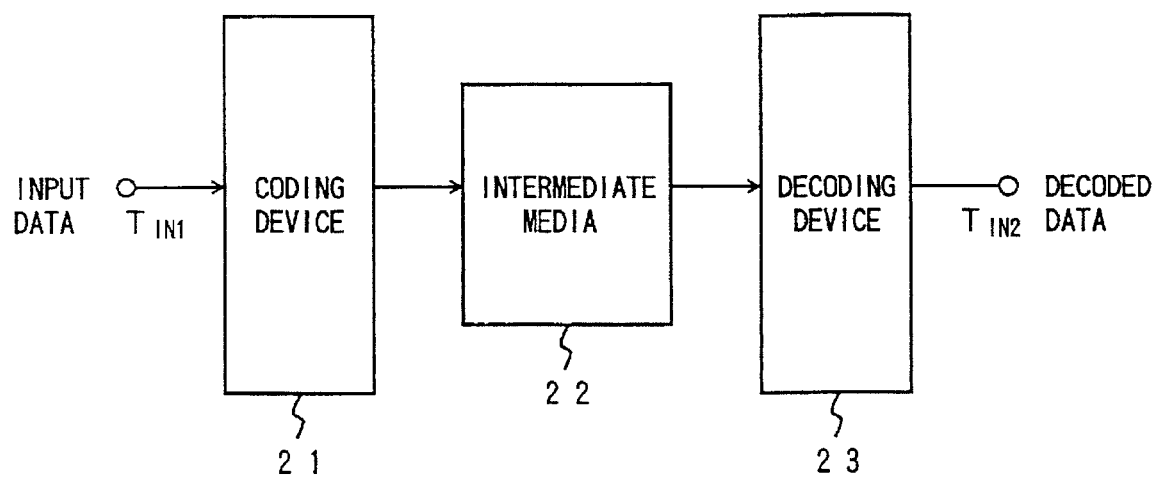
FIG. 8 is a block diagram of an embodiment of the present invention.

FIG. 8 shows a block diagram of an embodiment of the present invention. A coding device 21 receives input data at an input node $T_{IN1}$. The coding device 21 encodes the input data through the multi-level arithmetic coding method, and generates coded data.

The coded data generated by the coding device 21 is supplied to a decoding device 23 via an intermediate media 22 such as a recording/reproducing device, a communication device, etc. The decoding device 23 decodes the coded data through an inverse process to that of the coding device 21. Thus, the data is reconstructed and provided at a node $T_{IN2}$.

Figure 9:
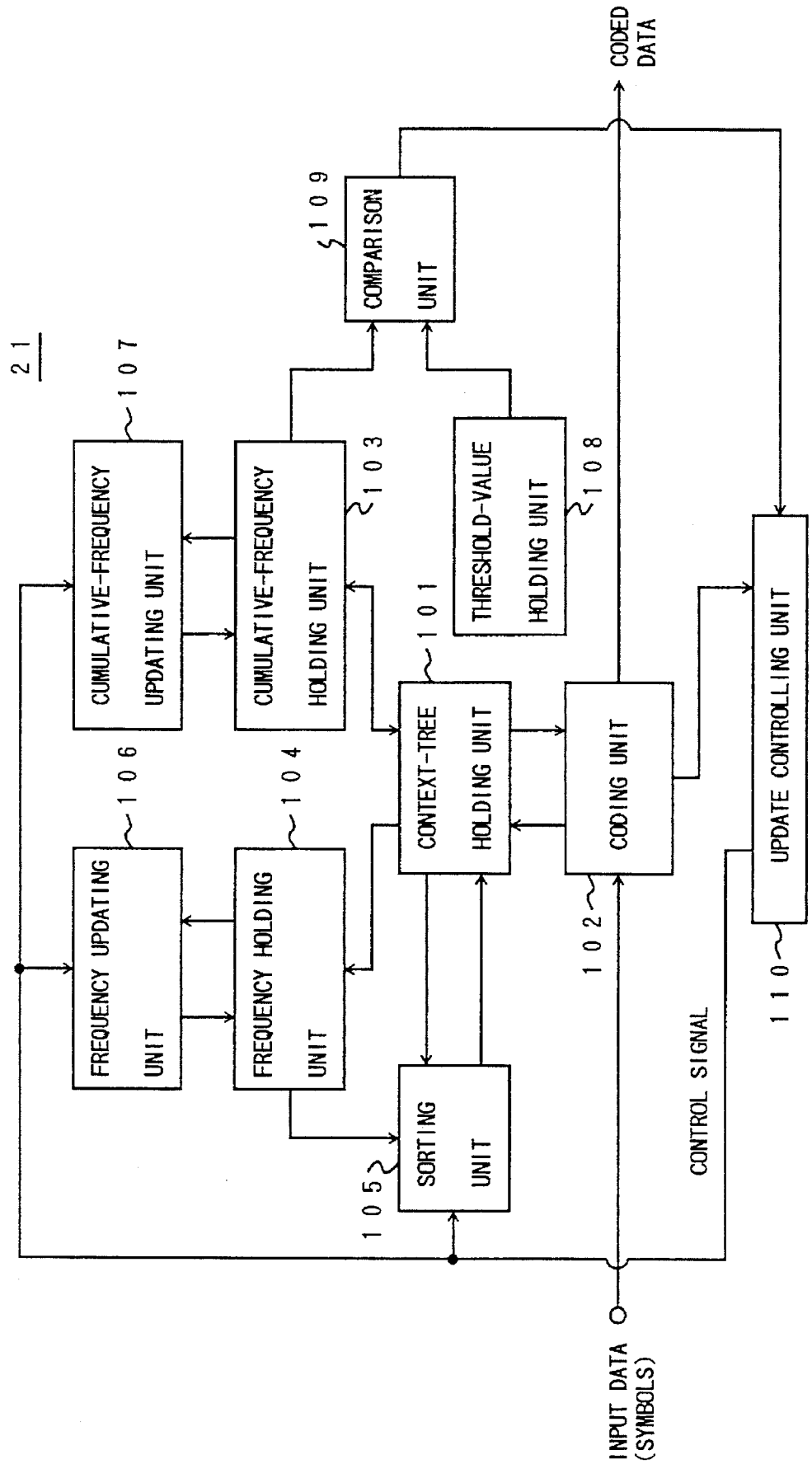
FIG. 9 is a block diagram of a coding device of FIG. 8.

FIG. 9 shows a block diagram of the coding device 21. The coding device 21 include a context-tree holding unit 101, a coding unit 102, a cumulative-frequency holding unit 103, a frequency holding unit 104, a sorting unit 105, a frequency updating unit 106, a cumulative-frequency updating unit 107, a threshold-value holding unit 108, a comparison unit 109, and an update controlling unit 110.

The context-tree holding unit 101 stores a context tree which is generated based on input data of the past. The coding unit 102 receives symbols, and encodes them based on the context tree stored in the context-tree holding unit 101. The cumulative-frequency holding unit 103 stores cumulative frequency of each symbol which makes up the context tree. The frequency holding unit 104 stores frequency of occurrence for each symbol. The sorting unit 105 reads the frequency of occurrence for each symbol from the frequency holding unit 104, and reshapes the context tree according to the frequency of occurrence. The frequency updating unit 106 updates the frequency of occurrence stored in the frequency holding unit 104. The cumulative-frequency updating unit 107 updates the cumulative frequency stored in the cumulative-frequency holding unit 103.

The threshold-value holding unit 108 stores a threshold value which is used in making a decision to stop the updating of the frequency, the cumulative frequency, and the context tree. The comparison unit 109 compares the threshold value stored in the threshold-value holding unit 108 with the cumulative frequency stored in the cumulative-frequency holding unit 103. Then, the comparison unit 109 outputs a comparison-output signal, which is a low level signal when the cumulative frequency is less than the threshold value, and which is a high level when the cumulative frequency is not less than the threshold value. The update controlling unit 110 controls the sorting unit 105, the frequency updating unit 106, and the cumulative-frequency updating unit 107 when a new symbol is supplied to the coding unit 102. In doing so, the update controlling unit 110 uses the comparison-output signal supplied thereto for determining whether to initiate the updating processes of the frequency, the cumulative frequency, and the context tree.

Details of the operation of the coding device 21 with regard to the updating process is as follows. The coding unit 101 supplies to the context-tree holding unit 101 an incoming symbol, which is to be coded, and a context consisting of preceding symbols. The context-tree holding unit 101 supplies an order of the frequency of occurrence of that incoming symbol to the coding unit 102 when the incoming symbol is registered. Here, the order of the frequency of occurrence refers to an order in the list, in which symbols are arranged in a descending order of the frequency of occurrence. When the incoming symbol is not registered, the context-tree holding unit 101 supplies an order of the frequency of occurrence of ESC (indicating no-registration) to the coding unit 102. Then, the order of the context tree is lowered until a registered incoming symbol is found. The coding unit 102 generates a code which corresponds to the order of frequency of occurrence supplied from the context-tree holding unit 101. When ESC is received, the coding units outputs ESC along with a code corresponding to the order of frequency of occurrence.

The comparison unit 109 compares the threshold value stored in the threshold-value holding unit 108 with the cumulative frequency regarding all the symbols listed under the pertinent context. The comparison unit 109 supplies the comparison-output signal to the update controlling unit 110. When the cumulative frequency is less than the threshold value, the update controlling unit 110 controls the frequency updating unit 106, the cumulative-frequency updating unit 107, and the sorting unit 105 to carry out a respective updating process.

The sorting unit 105 searches for a symbol which is located at the top of the list among symbols having the same frequency of occurrence as that of the coded symbol (before an increment). Then, the sorting unit 105 exchanges the searched symbol with the coded symbol. The frequency updating unit 106 increments the frequency of occurrence for the coded symbol by 1. The cumulative-frequency updating unit 107 increments the cumulative frequency of all symbols listed above the coded symbol by 1. When the comparison-output signal indicates that the cumulative frequency is not less than the threshold value, the updating process described above will not take place.

Figure 10:
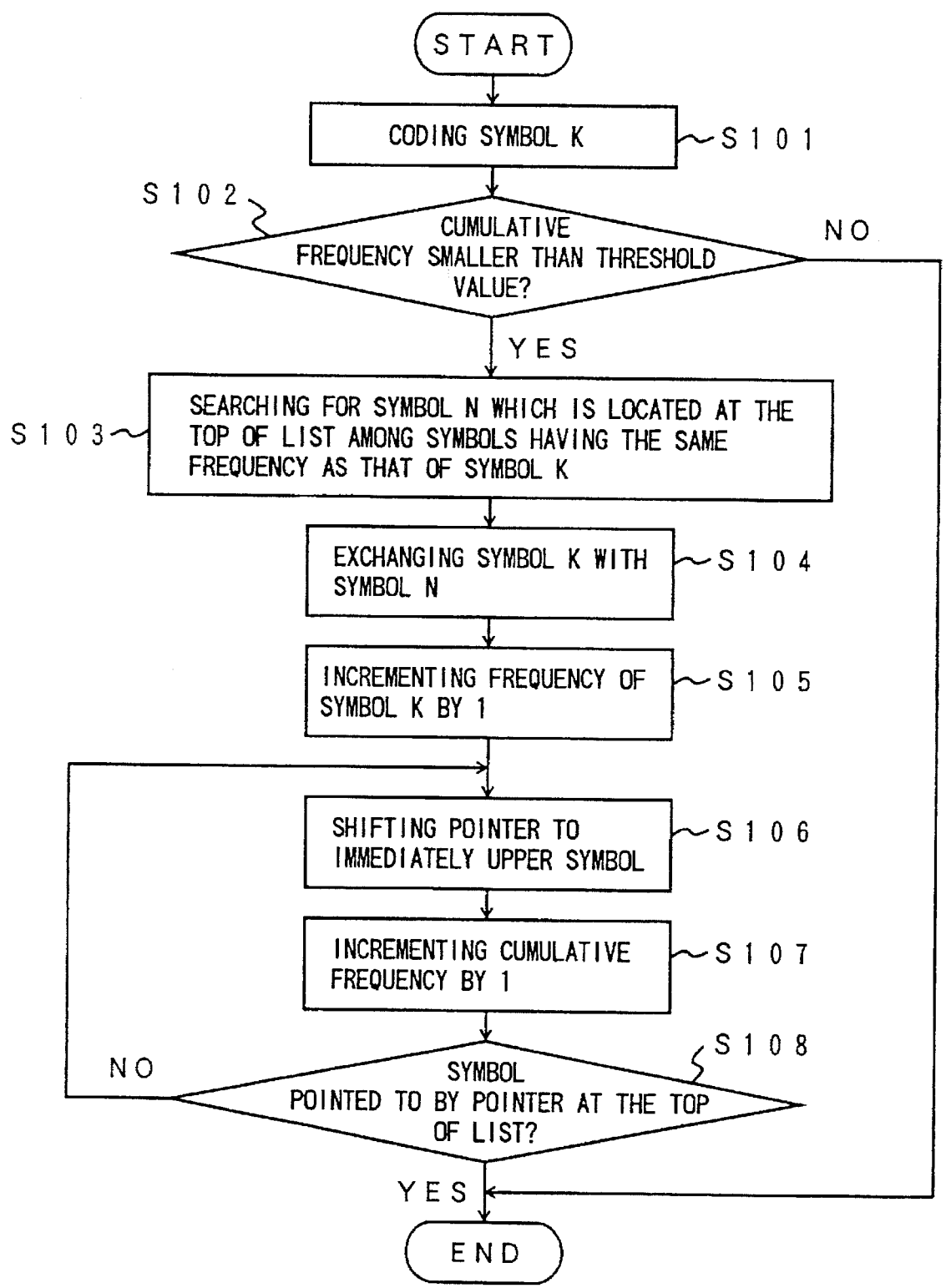
FIG. 10 is a flowchart of a process of the coding device.

FIG. 10 shows a flowchart of the updating process of the coding device 21.

At a step S101, a symbol K is coded by the coding unit 102. At a step S102, a check is made by the comparison unit 109 whether the cumulative frequency is less than the threshold value. If it is, the procedure proceeds to a step S103. If it is not, the procedure ends.

Here, a result of the check is indicated by the level of the comparison-output signal generated by the comparison unit 109. A low level signal indicates that the cumulative frequency is less than the threshold value. A high level signal indicates the contrary. Upon receiving the low level comparison-output signal, the update controlling unit 110 controls the sorting unit 105, the frequency updating unit 106, and the cumulative-frequency updating unit 107 to conduct the updating process.

At a step S103, the sorting unit 105 searches for a symbol N which is located at the top of the list among symbols having the same frequency as that of the symbol K. At a step S104, the symbol K is exchanged with the symbol N. At a step S105, the frequency updating unit 107 increments the frequency of the symbol K by 1.

At a step S106, the cumulative-frequency updating unit 107 shifts a pointer for pointing to a symbol such that the pointer points to the immediately upper symbol. At a step S107, the cumulative-frequency updating unit 107 increments by 1 the cumulative frequency of the symbol pointed to by the pointer.

At a step S108, the update controlling unit 110 checks whether the symbol pointed to by the pointer is at the top of the list. If it is, the procedure ends. If it is not, the procedure goes back to the step S106, and repeats the steps S106, S107, and S108. By doing this, the cumulative-frequency updating unit 107 increments by 1 the cumulative frequency of all the symbols listed above the symbol K.

As mentioned, if it turns out at the step S102 that the cumulative frequency is not less than the threshold value, the procedure ends at that point. This is because the update controlling unit 110 receives the high level comparison-output signal, and decides that the updating process is no longer necessary.

A study is conducted on an average number of incrementing operations executed for the cumulative frequency during the updating process. The study reveals that incrementing operations are executed on average 1.5 times for the context of the second order, 8.4 times for the context of the first order, and 48.5 times for the context of the zero-th order. That is, the number of incrementing operations for the zero-th order is far larger than that of the first order or the second order.

Accordingly, the control of the updating processing based on the threshold value may be applied only to the context of the zero-th order, yet reducing the number of incrementing operations by a significant amount. In this case, a degradation in the compression rate caused by the absence of the updating process can be sustained at a minimum level.

Figure 11:
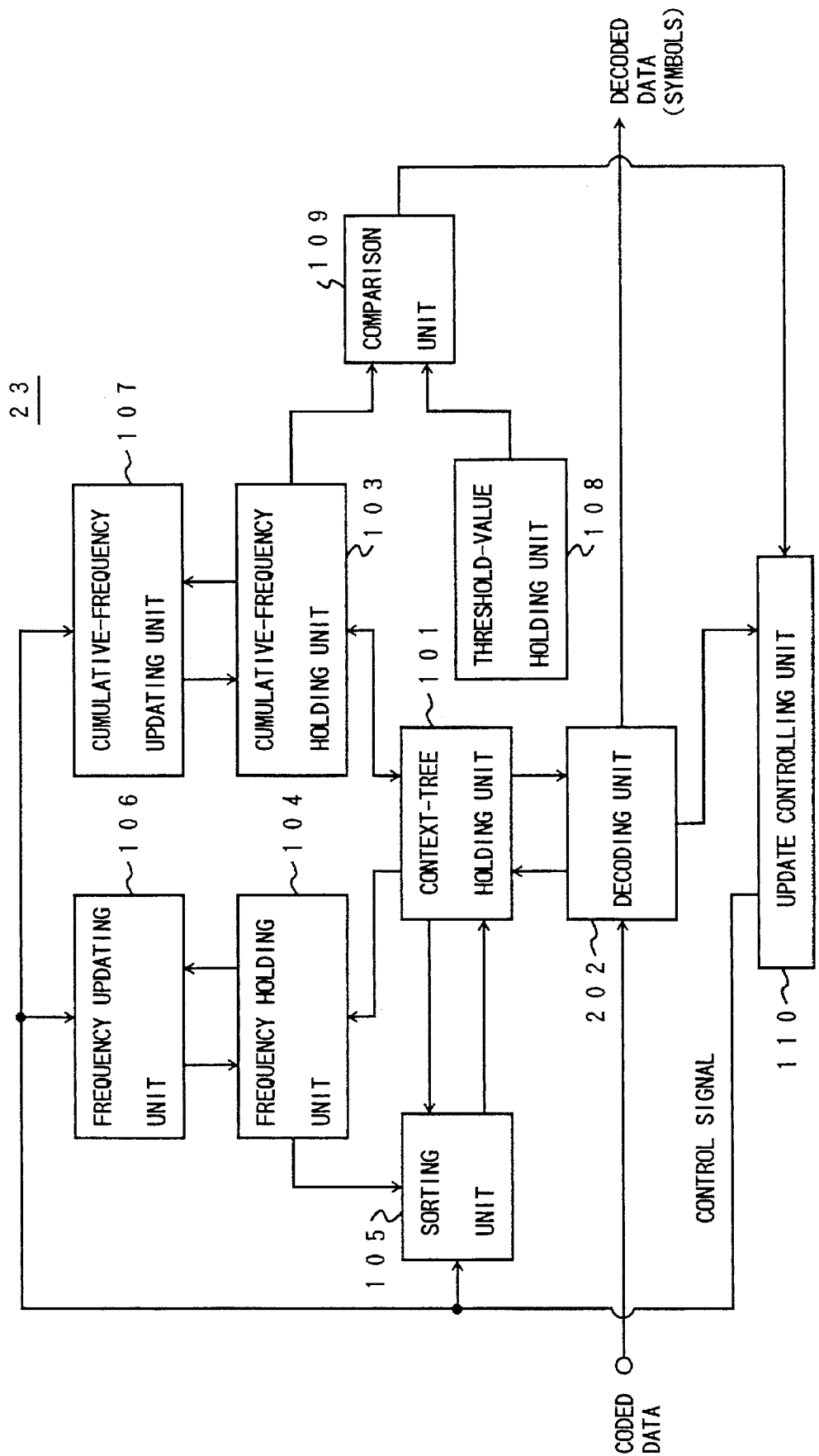
FIG. 11 is a block diagram of a decoding device of FIG. 8.

FIG. 11 shows a block diagram of the decoding device 23. In FIG. 11, the same elements as those in FIG. 9 are referred to by the same numerals, and a description thereof will be omitted.

The decoding device 23 of FIG. 11 differs from the coding device 21 of FIG. 9 only in the decoding unit 202, which replaces the coding unit 102. The coding device 21 generates the context tree from the input data. On the other hand, the decoding device 23 generates the context-tree from the decoded data which is decoded from the coded data.

Figure 12:
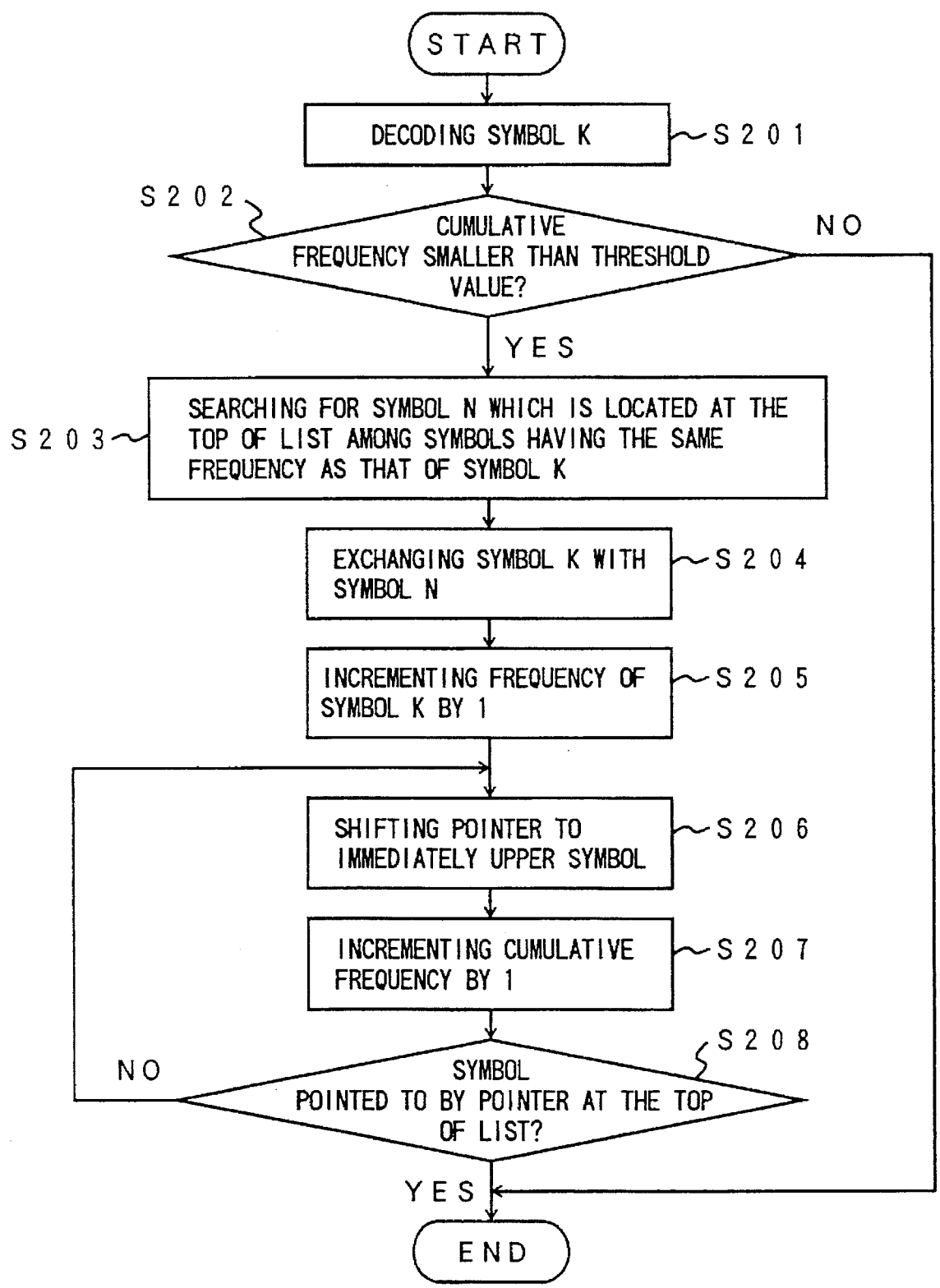
FIG. 12 is a flowchart of a process of the decoding device.

FIG. 12 shows a flowchart of the updating process of the decoding device 23.

At a step S201, a symbol K is decoded by the decoding unit 202. At a step S202, a check is made by the comparison unit 109 whether the cumulative frequency is less than the threshold value. If it is, the procedure proceeds to a step S203. If it is not, the procedure ends.

Here, a result of the check is indicated by the level of the comparison-output signal generated by the comparison unit 109. A low level signal indicates that the cumulative frequency is less than the threshold value. A high level signal indicates the contrary. Upon receiving the low-level comparison-output signal, the update controlling unit 110 controls the sorting unit 105, the frequency updating unit 106, and the cumulative-frequency updating unit 107 to conduct the updating process.

At a step S203, the sorting unit 105 searches for a symbol N which is located at the top of the list among symbols having the same frequency as that of the symbol K. At a step S204, the symbol K is exchanged with the symbol N. At a step S205, the frequency updating unit 107 increments the frequency of the symbol K by 1.

At a step S206, the cumulative-frequency updating unit 107 shifts a pointer for pointing to a symbol such that the pointer points to an immediately upper symbol. At a step S207, the cumulative-frequency updating unit 107 increments by 1 the cumulative frequency of a symbol pointed to by the pointer.

At a step S208, the update controlling unit 110 checks whether the symbol pointed to by the pointer is at the top of the list. If it is, the procedure ends. If it is not, the procedure goes back to the step S206, and repeats the steps S206, S207, and S208. By doing this, the cumulative-frequency updating unit 107 increments by 1 the cumulative frequency of all the symbols listed above the symbol K.

As mentioned, if it turns out at the step S202 that the cumulative frequency is not less than the threshold value, the procedure ends at that point. This is because the update controlling unit 110 receives the high level comparison-output signal, and decides that the updating process is no longer necessary.

Figure 13:
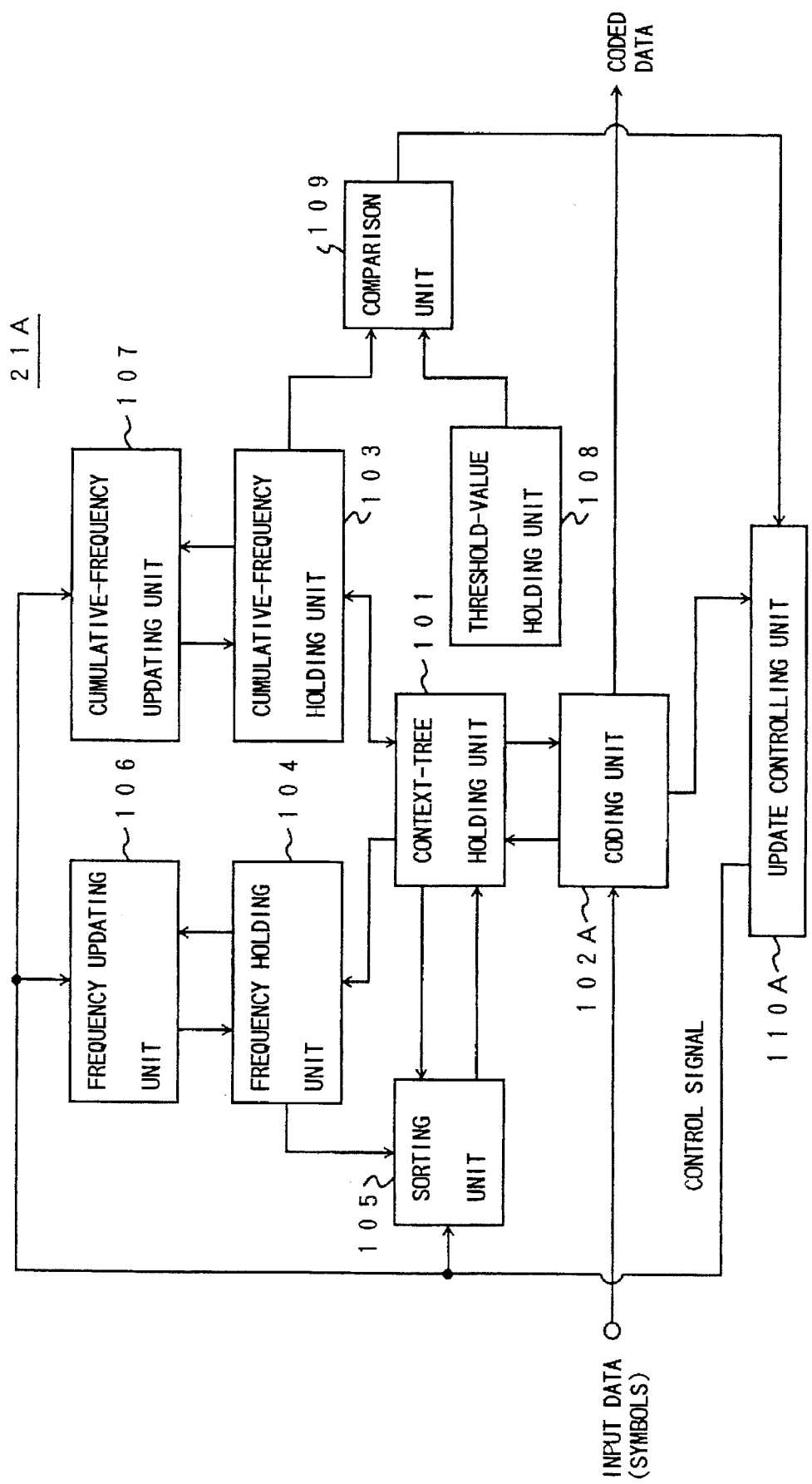
FIG. 13 is a block diagram of a coding device according to a variation of the embodiment.

FIG. 13 shows a block diagram of the coding device 21A according to a variation of the embodiment. In FIG. 13, the same elements as those in FIG. 9 are referred to by the same numerals, and a description thereof will be omitted.

The coding device 21A of FIG. 13 differs from the coding device 21 of FIG. 9 only in the coding unit 102A and the update controlling unit 110A.

In the variation of the embodiment, the coding unit 102A sends to the update control unit 110A a signal indicating an end of symbol coding and information indicating an order of the context with which the symbol is coded. Upon the end of symbol coding, the update controlling unit 110A initiates the updating processing based on the information provided by the coding unit 102A.

Figure 14:
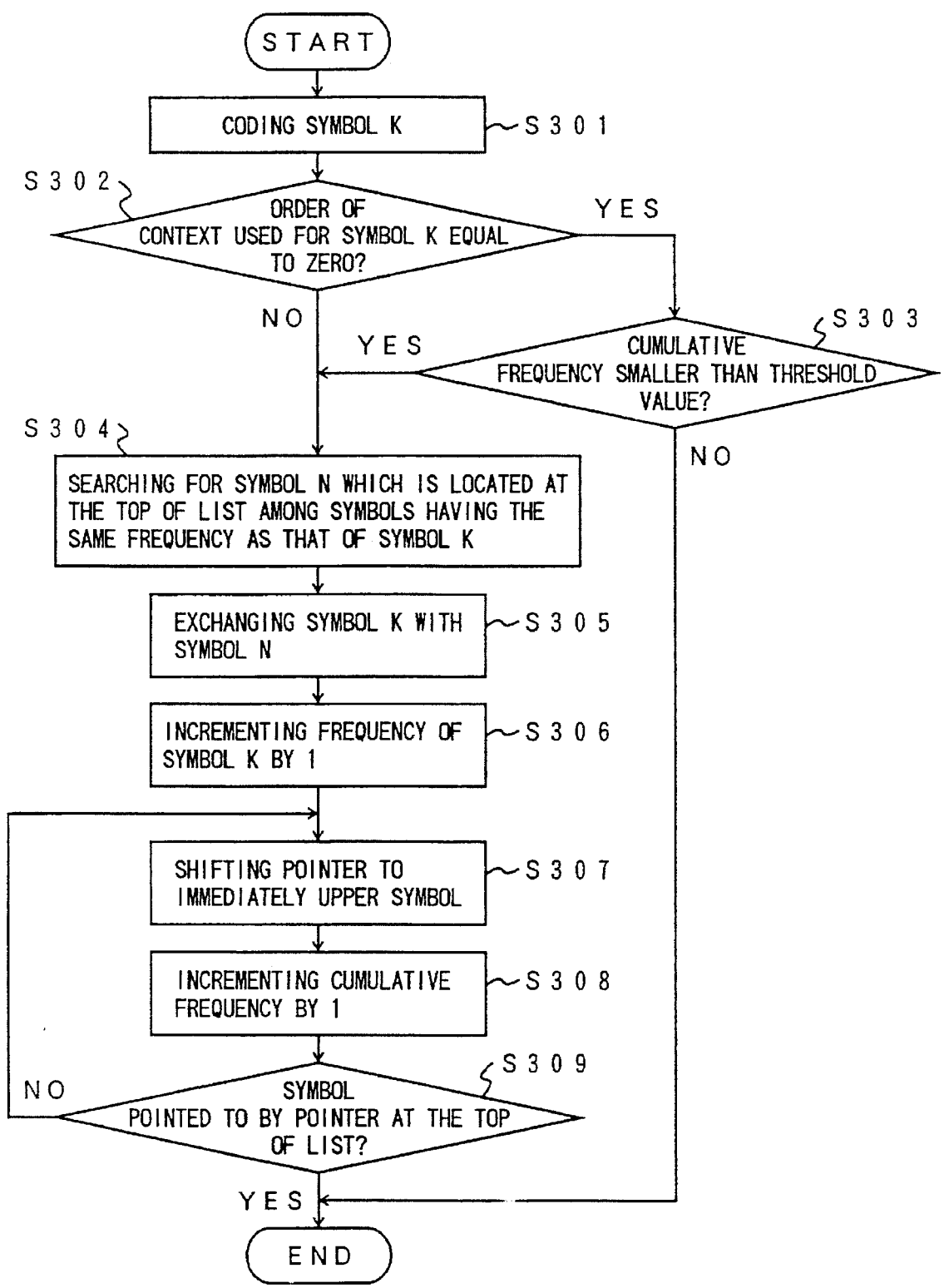
FIG. 14 is a flowchart of a process of the coding device of FIG. 13.

FIG. 14 shows a flowchart of the updating process of the coding device 21A.

At a step S301, a symbol K is coded by the coding unit 102A. At a step S302, a check is made whether the order of the context used for coding the symbol K is 0. This check may be made whether the order is smaller than a predetermined number. In this variation of the embodiment, the predetermined number is set to 1. If the order is 0, the procedure goes to a step S303, otherwise the procedure goes to a step S304.

At a step S303, a check is made by the comparison unit 109 whether the cumulative frequency is smaller than the threshold value. If it is, the procedure proceeds to a step S304. If it is not, the procedure ends.

Here, a result of the check at the step S303 is indicated by the level of the comparison-output signal generated by the comparison unit 109. A low level signal indicates that the cumulative frequency is less than the threshold value. A high level signal indicates the contrary. Upon receiving the low level comparison-output signal, the update controlling unit 110A controls the sorting unit 105, the frequency updating unit 106, and the cumulative-frequency updating unit 107 to conduct the updating process.

At a step S304, the sorting unit 105 searches for a symbol N which is located at the top of the list among symbols having the same frequency as that of the symbol K. At a step S305, the symbol K is exchanged with the symbol N. At a step S306, the frequency updating unit 107 increments the frequency of the symbol K by 1.

At a step S307, the cumulative-frequency updating unit 107 shifts a pointer for pointing to a symbol such that the pointer points to an immediately upper symbol. At a step S308, the cumulative-frequency updating unit 107 increments by 1 the cumulative frequency of a symbol pointed to by the pointer.

At a step S309, the update controlling unit 110A checks whether the symbol pointed to by the pointer is at the top of the list. If it is, the procedure ends. If it is not, the procedure goes back to the step S307, and repeats the steps S307, S308, and S309. By doing this, the cumulative-frequency updating unit 107 increments by 1 the cumulative frequency of all the symbols listed above the symbol K.

As mentioned, if it turns out at the step S303 that the cumulative frequency is not less than the threshold value, the procedure ends at that point. This is because the update controlling unit 110A receives the high level comparison-output signal, and decides that the updating process is no longer necessary.

Also, if it turns out at the step S302 that the order of the context used for coding the symbol K is not zero, the processes of the steps S4 through S9 are always carried out. Thus, no matter what the cumulative frequency is, the updating processing of the frequency, the cumulative frequency, and the context tree is conducted.

Figure 15:
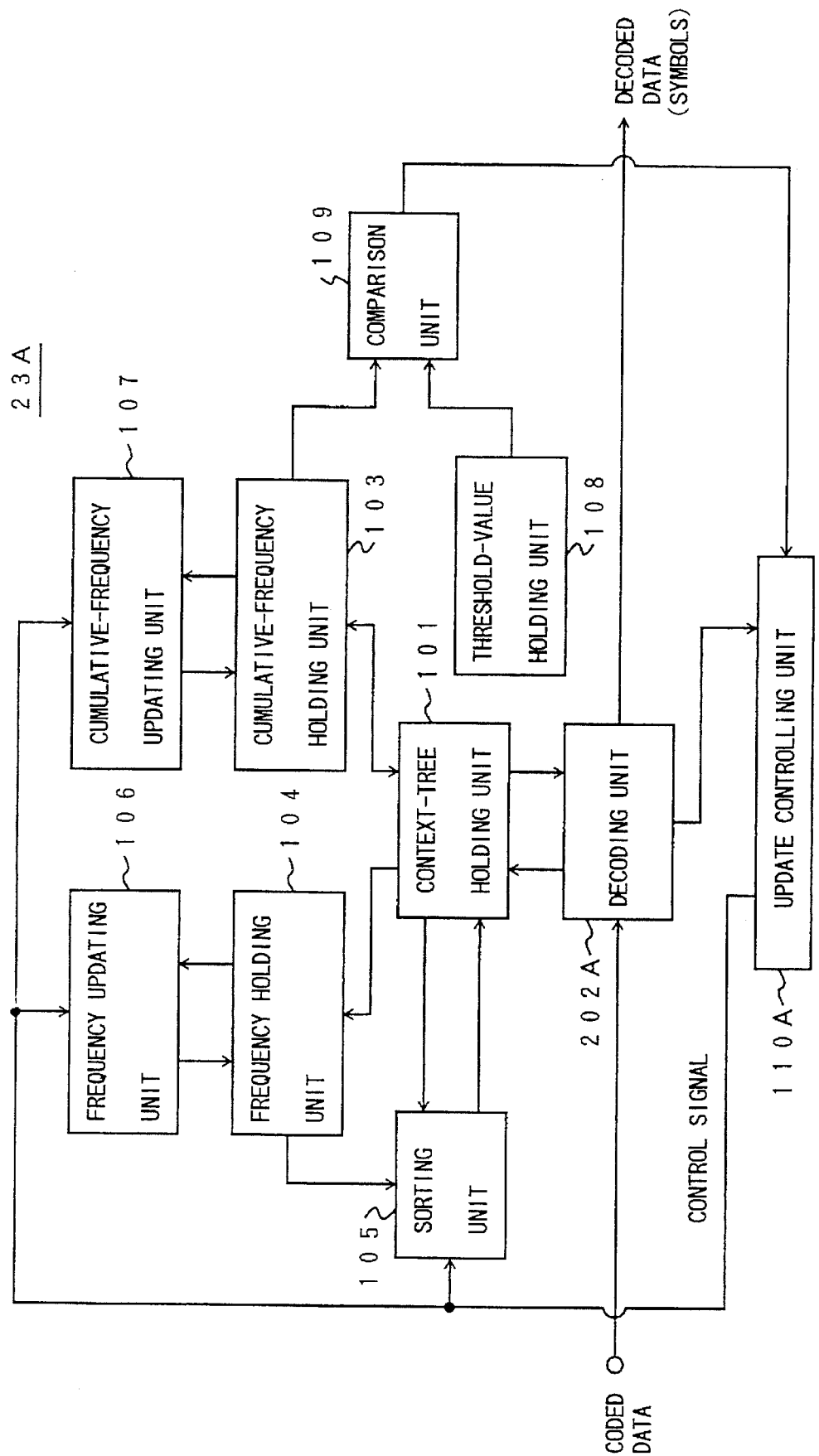
FIG. 15 is a block diagram of a decoding device according to a variation of the embodiment.

FIG. 15 shows a block diagram of the decoding device 23A according to a variation of the embodiment. In FIG. 15, the same elements as those in FIG. 11 are referred to by the same numerals, and a description thereof will be omitted.

The decoding device 23A of FIG. 15 differs from the decoding device 23 of FIG. 11 only in the decoding unit 202A and the update controlling unit 110A.

In the variation of the embodiment, the decoding unit 202A sends to the update control unit 110A a signal indicating an end of symbol coding and information indicating the order of the context with which the symbol is coded. Upon the end of symbol coding, the update controlling unit 110A initiates the updating processing based on the information provided by the decoding unit 202A.

Figure 16:
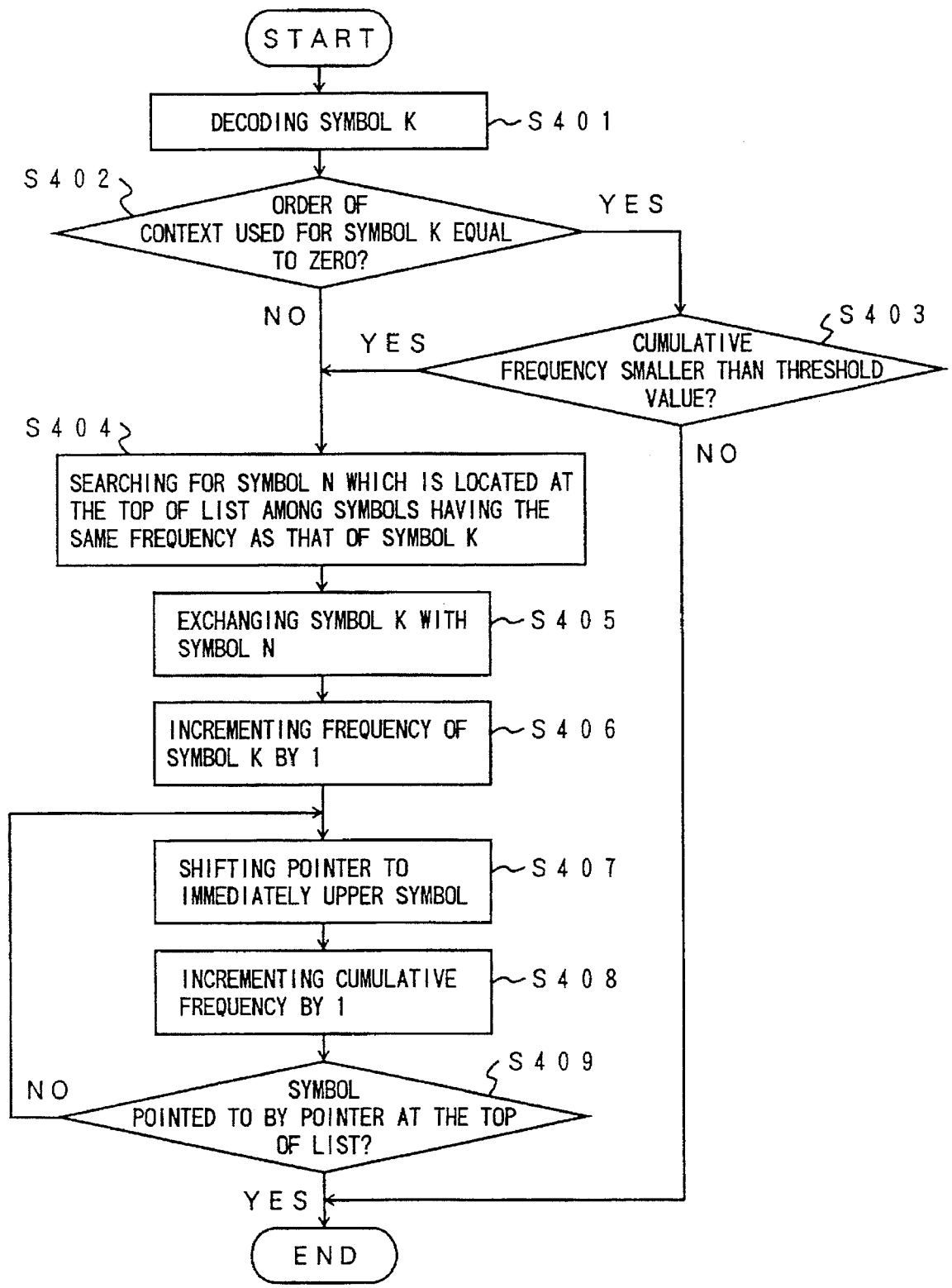
FIG. 16 is a flowchart of a process of the decoding device of FIG. 15.

FIG. 16 shows a flowchart of the updating process of the decoding device 23A.

At a step S401, a symbol K is decoded by the decoding unit 202A. At a step S402, a check is made whether the order of the context used for decoding the symbol K is 0. This check may be made whether the order is smaller than a predetermined number. In this variation of the embodiment, the predetermined number is set to 1. If the order is 0, the procedure goes to a step S403, otherwise the procedure goes to a step S404.

At a step S403, a check is made by the comparison unit 109 whether the cumulative frequency is less than the threshold value. If it is, the procedure proceeds to a step S404. If it is not, the procedure ends.

Here, a result of the check at the step S403 is indicated by the level of the comparison-output signal generated by the comparison unit 109. A low level signal indicates that the cumulative frequency is less than the threshold value. A high level signal indicates the contrary. Upon receiving the low level comparison-output signal, the update controlling unit 110A controls the sorting unit 105, the frequency updating unit 106, and the cumulative-frequency updating unit 107 to conduct the updating process.

At a step S404, the sorting unit 105 searches for a symbol N located at the top of the list among symbols having the same frequency as that of the symbol K. At a step S405, the symbol K is exchanged with the symbol N. At a step S406, the frequency updating unit 107 increments the frequency of the symbol K by 1.

At a step S407, the cumulative-frequency updating unit 107 shifts a pointer for pointing to a symbol such that the pointer points to an immediately upper symbol. At a step S408, the cumulative-frequency updating unit 107 increments by 1 the cumulative frequency of a symbol pointed to by the pointer.

At a step S409, the update controlling unit 110A checks whether the symbol pointed to by the pointer is at the top of the list. If it is, the procedure ends. If it is not, the procedure goes back to the step S407, and repeats the steps S407, S408, and S409. By doing this, the cumulative-frequency updating unit 107 increments by 1 the cumulative frequency of all the symbols listed above the symbol K.

As mentioned, if it turns out at the step S403 that the cumulative frequency is not less than the threshold value, the procedure ends at that point. This is because the update controlling unit 110A receives the high level comparison-output signal, and decides that the updating process is no longer necessary.

Also, if it turns out at the step S402 that the order of the context used for coding the symbol K is not zero, the processes of the steps S4 through S9 are always carried out. Thus, no matter what the cumulative frequency is, the updating processing of the frequency, the cumulative frequency, and the context tree is conducted.

The description of the embodiment in the above has been given with regard to a case in which only one threshold value is used, i.e., a threshold value is the same for any context. However, a different threshold value may be provided for each context. This is useful because the number of the symbols registered under a given context is dependent on the given context. In English text, for example, a large number of symbols are registered under such contexts as " " (space), ", " (comma), ". " (period), etc. By providing different threshold values according to the frequency of occurrence, degradation of the compression rate can be minimized.

Since the use of a different threshold value for each context leads to a complexity of the coding process, a different threshold value can be provided for each order of contexts. Despite the dependency on the contexts, a smaller number of symbols are registered under a context of a higher order. This means that a longer processing time is required for the updating process of the smaller order. Thus, preparing a different threshold value for each order can bring about an efficient processing. Especially, under contexts of the zero-th order, all the symbols are registered ranging from 0x00 to 0xFF plus a special code EOF (end of file). The processing time of the zero-th order is far larger than those of other orders. Thus, the control of the updating process according to the present invention can be very effective even if it is applied only to the contexts of the zero-th order. In this case, the control of the entire process is simple, and an increase in circuit complexity is minimized.

As described above, according to the present invention, whether or not to carry out the updating process is controlled according to the cumulative frequency of occurrence derived from the input data. Thus, the updating process can be stopped when data of the contexts is sufficiently collected, so that the updating process is not unduly carried out. This results in a higher processing speed.

Also, according to the present invention, the updating process may be stopped only for contexts below a predetermined order. That is, the updating process is stopped only for contexts with a large number of registered symbols. This results in a degradation in the compression rate being sustained at a minimum level.

Further, the present invention is not limited to these embodiments, but various variations and modifications may be made without departing from the scope of the present invention.

What is claimed is:

1. A device for coding a series of symbols based on a multi-level arithmetic coding scheme, said device comprising:

coding means for coding said symbols based on frequency of occurrence of said symbols and orders of said symbols according to said frequency of occurrence;

context holding means for storing said frequency of occurrence and said orders;

context updating means for updating said frequency of occurrence and said orders upon receiving a control signal; and controlling means for sending said control signal when one of said symbols is coded and a cumulative frequency is less than a predetermined value, wherein said cumulative frequency is a sum of said frequency of occurrence for all of said symbols.

2. The device as claimed in claim 1, wherein said context holding means lists said frequency of occurrence and said orders under each context of said symbols; and said context updating means updates said frequency of occurrence and said orders for a given context which is used for coding said one of said symbols, and wherein said cumulative frequency is a sum of said frequency of occurrence for said symbols listed under said given context.

3. The device as claimed in claim 2, wherein said each context is provided with a particular one of said predetermined value.

4. The device as claimed in claim 2, wherein said predetermined value is provided for said each context according to a number of said symbols contained in said each context.

5. The device as claimed in claim 2, wherein said predetermined value is provided only for a zero-th context which is in the absence of said symbols, and said controlling means sends said control signal whenever said each context containing at least one of said symbols is used for coding said one of said symbols.

6. A device for decoding coded data to obtain a series of symbols based on a multi-level arithmetic decoding scheme, said device comprising:

decoding means for decoding said coded data to obtain said symbols based on frequency of occurrence of said symbols and orders of said symbols according to said frequency of occurrence;

context holding means for storing said frequency of occurrence and said orders;

context updating means for updating said frequency of occurrence and said orders upon receiving a control signal; and controlling means for sending said control signal when one of said symbols is obtained and a cumulative frequency is less than a predetermined value, wherein said cumulative frequency is a sum of said frequency of occurrence for all of said symbols.

7. The device as claimed in claim 6, wherein said context holding means lists said frequency of occurrence and said orders under each context of said symbols; and said context updating means updates said frequency of occurrence and said orders for a given context which is used for obtaining said one of said symbols, and wherein said cumulative frequency is a sum of said frequency of occurrence for said symbols listed under said given context.

8. The device as claimed in claim 7, wherein said each context is provided with a particular one of said predetermined value.

9. The device as claimed in claim 7, wherein said predetermined value is provided for said each context according to a number of said symbols contained in said each context.

10. The device as claimed in claim 7, wherein said predetermined value is provided only for a zero-th context which is in the absence of said symbols, and said controlling means sends said control signal whenever said each context containing at least one of said symbols is used for obtaining said one of said symbols.

11. A device for coding a series of symbols to generate coded data and for decoding said coded data to obtain said series of said symbols based on a multi-level arithmetic coding scheme, said device comprising:

a coding unit comprising:
coding means for coding said symbols based on first frequency of occurrence of said symbols and first orders of said symbols according to said first frequency of occurrence;

first context holding means for storing said first frequency of occurrence and said first orders;

first context updating means for updating said first frequency of occurrence and said first orders upon receiving a first control signal; and first controlling means for sending said first control signal when one of said symbols is coded and a first cumulative frequency is less than a first predetermined value, wherein said first cumulative frequency is a sum of said first frequency of occurrence for all of said symbols, and a decoding unit comprising:
decoding means for decoding said coded data to obtain said symbols based on second frequency of occurrence of said symbols and second orders of said symbols according to said second frequency of occurrence;

second context holding means for storing said second frequency of occurrence and said second orders;

second context updating means for updating said second frequency of occurrence and said second orders upon receiving a second control signal; and second controlling means for sending said second control signal when one of said symbols is obtained and a second cumulative frequency is less than a second predetermined value, wherein said second cumulative frequency is a sum of said second frequency of occurrence for all of said symbols.

12. A method of coding a series of symbols based on a multi-level arithmetic coding scheme, said method comprising the steps of:

a) storing frequency of occurrence of said symbols and orders of said symbols according to said frequency of occurrence;

a) coding said symbols based on said frequency of occurrence and said orders; and c) updating said frequency of occurrence and said orders when one of said symbols is coded and a cumulative frequency is less than a predetermined value, wherein said cumulative frequency is sum of said frequency of occurrence for all of said symbols.

13. The method as claimed in claim 12, wherein said step a) lists said frequency of occurrence and said orders under each context of said symbols; and said step c) updates said frequency of occurrence and said orders for a given context which is used for coding said one of said symbols, and wherein said cumulative frequency is a sum of said frequency of occurrence for said symbols listed under said given context.

14. The method as claimed in claim 13, wherein said each context is provided with a particular one of said predetermined value.

15. The method as claimed in claim 13, wherein said predetermined value is provided for said each context according to a number of said symbols contained in said each context.

16. The method as claimed in claim 13, wherein said predetermined value is provided only for a zero-th context which is in the absence of said symbols, and said step c) updates said frequency of occurrence and said orders whenever said each context containing at least one of said symbols is used for coding said one of said symbols.

17. A method of decoding coded data to obtain a series of symbols based on a multi-level arithmetic decoding scheme, said method comprising the steps of:

a) storing frequency of occurrence of said symbols and orders of said symbols according to said frequency of occurrence;

b) decoding said coded data to obtain said symbols based on said frequency of occurrence and said orders; and c) updating said frequency of occurrence and said orders when one of said symbols is obtained and a cumulative frequency is less than a predetermined value, wherein said cumulative frequency is a sum of said frequency of occurrence for all of said symbols.

18. The method as claimed in claim 17, wherein said step a) lists said frequency of occurrence and said orders under each context of said symbols; and said step c) updates said frequency of occurrence and said orders for a given context which is used for obtaining said one of said symbols, and wherein said cumulative frequency is a sum of said frequency of occurrence for said symbols listed under said given context.

19. The method as claimed in claim 18, wherein said each context is provided with a particular one of said predetermined value.

20. The method as claimed in claim 18, wherein said predetermined value is provided for said each context according to a number of said symbols contained in said each context.

21. The method as claimed in claim 18, wherein said predetermined value is provided only for a zero-th context which is in the absence of said symbols, and said step c) updates said frequency of occurrence and said orders whenever said each context containing at least one of said symbols is used for obtaining said one of said symbols.

22. A method of coding a series of symbols to generate coded data and for decoding said coded data to obtain said series of said symbols based on a multi-level arithmetic coding scheme, said method comprising the steps of:

a) storing first frequency of occurrence of said symbols and first orders of said symbols according to said first frequency of occurrence;

b) coding said symbols based on said first frequency of occurrence and said first orders;

c) updating said first frequency of occurrence and said first orders when one of said symbols is coded and a first cumulative frequency is less than a first predetermined value, wherein said first cumulative frequency is a sum of said first frequency of occurrence for all of said symbols;

d) storing second frequency of occurrence of said symbols and second orders of said symbols according to said second frequency of occurrence;

e) decoding said coded data to obtain said symbols based on said second frequency of occurrence and second orders; and f) updating said second frequency of occurrence and said second orders when one of said symbols is obtained and a second cumulative frequency is less than a second predetermined value, wherein said second cumulative frequency is a sum of said second frequency of occurrence for all of said symbols.

* * * * *